(12) United States Patent
Schindler et al.

(10) Patent No.: US 8,987,708 B2
(45) Date of Patent: Mar. 24, 2015

(54) OPTOELECTRONIC COMPONENT

(75) Inventors: Florian Schindler, Traunstein (DE); Benjamin Claus Krummacher, Regensburg (DE); Norwin Von Malm, Nittendorf (DE); Dirk Berben, Bobingen (DE); Frank Jermann, Koenigsbrunn (DE); Martin Zachau, Geltendorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 1399 days.

(21) Appl. No.: 12/680,324

(22) PCT Filed: Aug. 6, 2008

(86) PCT No.: PCT/DE2008/001292
§ 371 (c)(1),
(2), (4) Date: Sep. 26, 2011

(87) PCT Pub. No.: WO2009/039803
PCT Pub. Date: Apr. 2, 2009

(65) Prior Publication Data
US 2012/0032211 A1   Feb. 9, 2012

(30) Foreign Application Priority Data

Sep. 26, 2007  (DE) .................. 10 2007 046 028
Oct. 24, 2007  (DE) .................. 10 2007 050 876

(51) Int. Cl.
*H01L 33/00*  (2010.01)
*H01L 51/52*  (2006.01)
*H01L 27/32*  (2006.01)

(52) U.S. Cl.
CPC ........... *H01L 51/5265* (2013.01); *H01L 27/322* (2013.01)

USPC .............................................. 257/40; 257/98

(58) Field of Classification Search
CPC ........................... H01L 51/0545; H01L 33/60
USPC ....................................... 257/40, 98
See application file for complete search history.

(56) References Cited

U.S. PATENT DOCUMENTS 6,066,861 A   5/2000  Höhn et al.
6,616,862 B2  9/2003  Srivastava et al.

(Continued)

FOREIGN PATENT DOCUMENTS

CN   1577902 A   2/2005
CN   1652642     8/2005

(Continued)

*Primary Examiner* — Tran Tran
(74) *Attorney, Agent, or Firm* — Cozen O'Connor

(57) ABSTRACT

An optoelectronic component comprises an organic layer sequence (1), which emits an electromagnetic radiation (15) having a first wavelength spectrum during operation, and also a dielectric layer sequence (2) and a wavelength conversion region (3) in the beam path of the electromagnetic radiation (15) emitted by the organic layer sequence (1). The wavelength conversion region (3) is configured to convert at least partially electromagnetic radiation having the first wavelength spectrum into an electromagnetic radiation (16) having a second wavelength spectrum. The dielectric layer sequence (2) is arranged in the beam path of the electromagnetic radiation (15) emitted by the organic layer sequence between the organic layer sequence (1) and the wavelength conversion region (3) and is at least partially opaque to an electromagnetic radiation having a third wavelength spectrum, which corresponds to at least one part of the second wavelength spectrum.

15 Claims, 2 Drawing Sheets

(56) References Cited

U.S. PATENT DOCUMENTS

| | | |
|---|---|---|
| 6,888,305 B2 | 5/2005 | Weaver |
| 2002/0175619 A1 | 11/2002 | Kita et al. |
| 2003/0094893 A1 | 5/2003 | Ellens et al. |
| 2004/0056256 A1 | 3/2004 | Bokor et al. |
| 2004/0062699 A1 | 4/2004 | Oshio |
| 2006/0038752 A1 | 2/2006 | Winters |
| 2006/0158403 A1 | 7/2006 | Kuma |
| 2006/0163591 A1 | 7/2006 | Diekmann |
| 2006/0220509 A1 | 10/2006 | Ghosh et al. |

FOREIGN PATENT DOCUMENTS

| | | |
|---|---|---|
| DE | 19638667 | 4/1998 |
| DE | 100 36 940 | 2/2002 |
| DE | 101 47 040 | 4/2003 |
| EP | 1 445 988 | 10/2002 |
| EP | 1 406 474 | 9/2003 |
| EP | 1 804 092 | 12/2006 |
| GB | 2 418 776 | 4/2006 |
| JP | 11-500584 | 1/1999 |
| JP | 2002-359076 | 12/2002 |
| JP | 2006-505092 | 2/2006 |
| JP | 2006-269226 | 10/2006 |
| TW | 200610440 | 3/2006 |
| TW | 200620208 | 6/2006 |
| TW | 200717879 | 5/2007 |
| WO | WO 97/50132 | 12/1997 |
| WO | WO 98/12757 | 3/1998 |
| WO | WO 00/33390 | 6/2000 |
| WO | WO 03/052842 | 6/2003 |
| WO | WO 2007/036214 | 4/2007 |

OPTOELECTRONIC COMPONENT

RELATED APPLICATIONS

This is a U.S. national stage of application No. PCT/DE2008/001292, filed on Aug. 6, 2008, This application claims the priority of German application no. 10 2007 046 028.9 filed Sep. 26, 2007 and 10 2007 050 876.1 filed Oct. 24, 2007, the entire content of both of which is hereby incorporated by reference.

FIELD OF THE INVENTION

The present invention relates to an organic optoelectronic component which can emit electromagnetic radiation during operation.

SUMMARY OF THE INVENTION

One object of specific embodiments of the present invention is to provide an optoelectronic component comprising a wavelength conversion region, which component can emit electromagnetic radiation with an increased efficiency during operation.

An optoelectronic component in accordance with one embodiment of the invention comprises, in particular, an organic layer sequence, which emits an electromagnetic radiation having a first spectrum during operation, and also a dielectric layer sequence and a wavelength conversion region in the beam path of the electromagnetic radiation emitted by the organic layer sequence. The wavelength conversion region is configured to convert at least partially electromagnetic radiation having the first wavelength spectrum into an electromagnetic radiation having a second wavelength spectrum. The dielectric layer sequence is arranged in the beam path of the electromagnetic radiation emitted by the organic layer sequence between the organic layer sequence and the wavelength conversion region and is at least partially opaque to an electromagnetic radiation having a third wavelength spectrum, which corresponds to at least one part of the second wavelength spectrum.

In particular, an emitted electromagnetic radiation can in this case be perceived by an observer during operation of the optoelectronic component. Said radiation can substantially correspond to a superimposition of the electromagnetic radiation having the first spectrum, which is emitted by the wavelength conversion region without wavelength conversion, and the electromagnetic radiation having the second wavelength spectrum, which is emitted by the wavelength conversion region.

In this case, during the operation of the optoelectronic component, the electromagnetic radiation having the first wavelength spectrum is emitted by the organic layer sequence and impinges on the wavelength conversion region after passing through the dielectric layer sequence. The electromagnetic radiation having the first wavelength spectrum is converted at least partially into electromagnetic radiation having the second wavelength spectrum. The electromagnetic radiation having the second wavelength spectrum is usually emitted isotropically, that is to say in different directions. To put it another way, part of the electromagnetic radiation having the second wavelength spectrum is emitted in the direction of the organic layer sequence and the dielectric layer sequence, that is to say counter to the beam path of the electromagnetic radiation having the first wavelength spectrum.

Since the dielectric layer sequence is opaque to electromagnetic radiation having the third wavelength spectrum, which corresponds to at least one part of the second wavelength spectrum, the converted electromagnetic radiation having the second spectrum cannot reach the region of the organic layer sequence. Consequently, it is possible to prevent the electromagnetic radiation having the second wavelength spectrum from being energetically absorbed in the organic layer sequence. The efficiency of the optoelectronic component can be increased as a result of the lower or reduced absorption in the organic layer sequence.

In one embodiment of the invention, "wavelength spectrum" or "spectrum" or "partial spectrum" denotes a spectral distribution of electromagnetic radiation having at least one spectral component having one wavelength or a plurality of spectral components having a plurality of wavelengths and/or ranges of wavelengths. A first spectrum and a second spectrum are hereinafter identical if the spectral components and the relative intensities thereof are identical in the case of the first and second spectra, where the absolute intensity of the first spectrum can deviate from the absolute intensity of the second spectrum.

In one embodiment of the invention, "partially" denotes a partial spectrum of a spectrum, for example of the first spectrum. In particular, the partial spectrum of a spectrum can consist of a part of the spectral components of this spectrum. Furthermore, "partially" can also denote a part of an intensity of a spectrum or partial spectrum.

In a further embodiment of the invention, "convert" can mean that the partial spectrum of the electromagnetic radiation having the first spectrum, which is converted at least partially into electromagnetic radiation having the second spectrum by the wavelength conversion region, and the second spectrum are not identical. This can mean, in particular, that the second spectrum has a spectral distribution that is different than the spectral distribution of the partial spectrum of the electromagnetic radiation having the first spectrum.

Furthermore, a wavelength conversion region can have an absorption spectrum and an emission spectrum, where the absorption spectrum and the emission spectrum are advantageously not identical. Preferably, the absorption spectrum in this case comprises the partial spectrum of the electromagnetic radiation having the first spectrum and the emission spectrum comprises the second spectrum. In particular, the absorption spectrum and the emission spectrum can each comprise further spectral components that are not contained in the partial spectrum of the electromagnetic radiation having the first spectrum and the second spectrum, respectively. Consequently, in the wavelength conversion region, an electromagnetic radiation having the second wavelength spectrum is generated from electromagnetic radiation having the first wavelength spectrum.

The dielectric layer sequence is preferably at least partially transparent to the electromagnetic radiation having the first wavelength spectrum. In this case, a transparency of the dielectric layer sequence to the electromagnetic radiation having the first wavelength spectrum can be dependent on a respective angle of incidence. By way of example, the dielectric layer sequence is transparent or at least partially transmissive to perpendicularly incident electromagnetic radiation having the first wavelength spectrum, while it is at least partially opaque to electromagnetic radiation having the first wavelength spectrum which impinges at a specific shallower angle.

The first wavelength spectrum comprises for example a blue and/or a green wavelength range, while the second wavelength spectrum comprises a yellow wavelength range. The third wavelength spectrum, which corresponds to at least one part of the second wavelength spectrum, can therefore likewise comprise a yellow wavelength range.

In one embodiment, the dielectric layer sequence at least predominantly reflects the electromagnetic radiation having the third wavelength spectrum.

Accordingly, by way of example the electromagnetic radiation having the first spectrum can pass in a substantially unimpeded manner from the organic layer sequence through the dielectric layer sequence into the wavelength conversion region, while electromagnetic radiation having the second or third wavelength spectrum, which is emitted or generated in the wavelength conversion region, is reflected from the dielectric layer sequence toward the outside, that is to say in an emission direction of the optoelectronic component.

In a further embodiment, the dielectric layer sequence has at least two layers having different dielectric constants. By way of example, in this case adjacent layers of the at least two layers have different refractive indexes. As a result of the jump in refractive index between the adjacent layers, a wavelength-dependent transmission or reflection of electromagnetic radiation can occur.

By way of example, the dielectric layer sequence has a limiting wavelength, wherein the dielectric layer sequence is substantially transmissive to electromagnetic radiation having a wavelength less than the limiting wavelength and is substantially opaque to electromagnetic radiation having a wavelength greater than the limiting wavelength. In this case, the limiting wavelength is dependent for example on the employed refractive indexes of the layers of the dielectric layer sequence and/or on respective layer thicknesses of the corresponding layers. In particular, interference effects of the electromagnetic radiation passing through the dielectric layer sequence can occur in this case. The dielectric layer sequence can for example be embodied in the manner of a Bragg mirror or be a Bragg mirror.

A transmission or a reflection of electromagnetic radiation at the dielectric layer sequence takes place in a manner free of losses, such that no absorption of electromagnetic radiation occurs. As a result, heating of the optoelectronic component during operation can advantageously be reduced.

In different embodiments, the dielectric layer sequence is embodied as a thin-film stack. The respective layers preferably have a thickness of less than 100 nm.

In different embodiments, the dielectric layer sequence and the wavelength conversion region can be in indirect or direct contact with the organic layer sequence. By way of example, the dielectric layer sequence is connected to the organic layer sequence directly or via additional interlayers.

In accordance with at least one embodiment, the dielectric layer sequence forms an encapsulation for the organic layer sequence. That is to say that, alongside its optical properties, the dielectric layer sequence forms a protection of the organic layer sequence against moisture and/or atmospheric gases. In this case, the dielectric layer sequence can in particular also cover side areas of the organic layer sequence. By way of example, the organic layer sequence is applied to a substrate. The dielectric layer sequence then covers the organic layer sequence on the parts of its surface which are not covered by the substrate. In this case, the dielectric layer sequence can be embodied as a thin-film encapsulation, in particular.

In further exemplary embodiments, the dielectric layer sequence and the wavelength conversion region are arranged spatially separately from the organic layer sequence. By way of example, the dielectric layer sequence and the wavelength conversion region are arranged in a manner spaced apart, by means of a carrier structure, from the organic layer sequence, which is encapsulated, for example. A region between the organic layer sequence or the encapsulation and the dielectric layer sequence and the wavelength conversion region can be filled with a noble gas, for example.

In a further embodiment, the dielectric layer sequence has a periodic succession of first and second layers.

For this purpose, the layers can comprise dielectric materials, for instance oxides, nitrides, sulfides and/or fluorides such as $MgF_2$, for example. In this case, the first layers can have a first refractive index and the second layers can have a second refractive index, wherein the first refractive index is different from the second refractive index. By way of example, the first layers can have a lower refractive index than the second layers and comprise silicon dioxide, for instance. The second layers can furthermore comprise a material having a higher refractive index, for instance titanium dioxide, zirconium dioxide or tantalum pentoxide. Further suitable materials can be aluminum oxide or silicon nitride, for instance. In this case, the thicknesses of the first and second layers can have for example approximately one quarter of the wavelength of a spectral component to be reflected. For this purpose, "thickness" can mean in particular the optical path length of electromagnetic radiation in a first and second layer, respectively. The thicknesses of different first layers and of different second layers, respectively, can be identical in this case. As an alternative or in addition, thicknesses of different first layers and of different second layers, respectively, can also be different. Depending on the reflectance to be obtained for the dielectric layer sequence, the latter can comprise one or a plurality of pairs of a first and a second layer.

Furthermore, the organic layer sequence can be embodied in particular as an organic light-emitting diode (OLED). In this case, an OLED can have an organic layer or a layer sequence comprising at least one organic layer, having an active region that can emit electromagnetic radiation during operation.

Furthermore, an OLED can have a first electrode and a second electrode, wherein the organic layer or the layer sequence comprising at least one organic layer having the active region can be arranged between the first and second electrodes. In this case, the first and the second electrode can be suitable for injecting "holes" and electrons, respectively, into the active region, which can recombine there with the emission of electromagnetic radiation.

Furthermore, the first electrode can be arranged on a substrate. The organic layer or the layer sequence comprising one or more functional layers composed of organic materials can be applied over the first electrode. The functional layers, which can comprise the active region, can in this case have electron transport layers, electroluminescent layers, and/or hole transport layers, for example. The second electrode can be applied over the functional layers or over the at least one organic layer.

By way of example, the substrate can comprise glass, quartz, plastic foils, metal, metal foils, silicon wafers or any other suitable substrate material. By way of example, the substrate can also be embodied as a layer sequence or laminate comprising a plurality of layers. If the semiconductor layer sequence is embodied as a so-called "bottom emitter", that is to say that the electromagnetic radiation generated in the active region can be emitted through the substrate, then the substrate can advantageously have a transparency to at least one part of the electromagnetic radiation. The wavelength conversion region and the filter layer can in this case be arranged on a side of the substrate which is remote from the semiconductor layer sequence.

In accordance with at least one embodiment, at least one of the electrodes comprises or consists of a transparent conductive oxide, a metal or a conductive organic material.

In the bottom emitter configuration, the first electrode can advantageously be transparent to at least one part of the electromagnetic radiation. A transparent first electrode, which can be embodied as an anode and can thus serve as material that injects positive charges or "holes", can for example comprise a transparent conductive oxide or consist of a transparent conductive oxide. Transparent conductive oxides ("TCO" for short) are transparent conductive materials, generally metal oxides, such as, for example, zinc oxide, tin oxide, cadmium oxide, titanium oxide, indium oxide or indium tin oxide (ITO). Alongside binary metal-oxygen compounds, such as, for example, ZnO, $SnO_2$ or $In_2O_3$, ternary metal-oxygen compounds, such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs. Furthermore, the TCOs need not necessarily correspond to a stoichiometric composition and can also be p- or n-doped. As an alternative or in addition, the first electrode can also comprise a metal, for example silver.

The semiconductor layer sequence comprising at least one organic layer can comprise polymers, oligomers, monomers, organic small molecules or other organic non-polymeric compounds or combinations thereof. In particular, it can be advantageous if a functional layer of the layer sequence is embodied as a hole transport layer in order to enable effective injection of holes into an electroluminescent layer or an electroluminescent region. Such structures concerning the active region or the further functional layers and regions are known to the person skilled in the art in particular with regard to materials, construction, function and structure, and therefore will not be explained in any greater detail at this juncture.

The second electrode can be embodied as a cathode and can thus serve as electron-inducing material. Inter alia, in particular aluminum, barium, indium, silver, gold, magnesium, calcium or lithium and compounds, combinations and alloys thereof can prove to be advantageous as cathode material. In addition or as an alternative, the second electrode can also be embodied in transparent fashion. This means, in particular, that the OLED can also be embodied as a "top emitter", that is to say that the electromagnetic radiation generated in the active region can be emitted on that side of the semiconductor layer sequence which is remote from the substrate. In this case, the wavelength conversion region and the filter layer can be arranged above the semiconductor layer sequence and in particular above the second electrode.

If an electrode which comprises the metallic layer or consists thereof is intended to be embodied as transmissive to the light emitted by the organic layer stack, then it can be advantageous if the metallic layer is made sufficiently thin. Preferably, the thickness of such a semitransparent metallic layer lies between 1 nm and 100 nm, inclusive of the limits.

Furthermore, the first electrode can be embodied as a cathode and the second electrode as an anode, wherein the semiconductor layer sequence can in this case be embodied as a bottom or top emitter. Moreover, the semiconductor layer sequence can be embodied simultaneously as a top emitter and as a bottom emitter.

The semiconductor layer sequence can have as active region a conventional pn junction, a double heterostructure, a single quantum well structure (SQW structure) or a multiple quantum well structure (MQW structure), for example. Alongside the active region, the semiconductor layer sequence can comprise further functional layers and functional regions, for instance p- or n-doped charge carrier transport layers, that is to say electron or hole transport layers, p- or n-doped confinement or cladding layers, buffer layers and/or electrodes and combinations thereof. Such structures concerning the active region or the further functional layers and regions are known to the person skilled in the art in particular with regard to construction, function and structure, and therefore will not be explained in any greater detail at this juncture.

In a further embodiment, the wavelength conversion region comprises at least one wavelength conversion substance. In accordance with at least one embodiment, the wavelength conversion region comprises at least one wavelength conversion substance from the group of garnets. In this case, the wavelength conversion substance can comprise for example particles from the group of cerium-doped garnets, in this case in particular cerium-doped yttrium aluminum garnet ($Y_3Al_5O_{12}$:Ce, YAG:Ce), cerium-doped terbium aluminum garnet (TAG:Ce), cerium-doped terbium yttrium aluminum garnet (TbYAG:Ce), cerium-doped gadolinium yttrium aluminum garnet (GdYAG:Ce) and cerium-doped gadolinium terbium yttrium aluminum garnet (GdTbYAG:Ce). Further possible wavelength conversion substances can be the following, for example:

- garnets of the rare earths and of the alkaline earth metals, as described for example in the document US 2004/062699 A1, the disclosure content of which in this regard is incorporated by reference,
- nitrides, sions and sialons, as described for example in the document DE 101 47 040 A1, the disclosure content of which in this regard is incorporated by reference,
- orthosilicates, sulfides and vanadates, as described for example in the document WO 00/33390 A1, the disclosure content of which in this regard is incorporated by reference,
- chlorosilicates, as described for example in the document DE 100 36 940 A1, the disclosure content of which in this regard is incorporated by reference, and
- aluminates, oxides, halophosphates, as described for example in the document U.S. Pat. No. 6,616,862 B2, the disclosure content of which in this regard is incorporated by reference.

Furthermore, the wavelength conversion region can also comprise suitable mixtures and combinations of the wavelength conversion substances mentioned.

In accordance with at least one embodiment, the wavelength conversion region comprises at least one dye. The dye can be at least one of the following substances:

- an organic dye,
- an inorganic dye,
- perylene,
- coumarin,
- a fluorescent dye.

In this case, the dye can also serve as a wavelength conversion substance.

Furthermore, the wavelength conversion region can comprise a transparent or at least partially radiation-transmissive matrix material, wherein the wavelength conversion substance can be embedded into the matrix material or be chemically bonded thereto. The transparent matrix material can comprise for example a transparent plastic, for instance silicones, epoxides, acrylates, imides, carbonates, olefins or derivatives thereof.

The wavelength conversion region can also be embodied as a foil. In other words, the wavelength conversion region consists for example of a plastic foil into which at least one wavelength conversion substance is introduced.

Furthermore, the wavelength conversion region can also be applied on a substrate comprising glass or a transparent plastic, for instance. In contrast to a foil, such a substrate can be self-supporting. In other words, it has an increased mechanical stability.

For different exemplary embodiments of the invention in which the organic layer sequence is embodied as a top emitter structure, the optoelectronic component can have an encapsulation disposed upstream or disposed downstream of the wavelength conversion region in the beam path of the electromagnetic radiation emitted by the organic layer sequence. To put it another way, the wavelength conversion region and the dielectric layer sequence can be encapsulated jointly with the organic layer sequence or, as an alterative, lie outside an encapsulation of the organic layer sequence. The encapsulation can in each case be embodied as a thin-film encapsulation.

DETAILED DESCRIPTION OF THE DRAWINGS

In the exemplary embodiments and figures, identical or identically acting constituent parts are in each case provided with the same reference symbols. The elements illustrated and their size relationships among one another should not be regarded as true to scale, in principle; rather, individual elements, such as layers, for example, may be illustrated with an exaggerated thickness for the sake of improved illustration and/or in order to afford a better understanding.

Figure 1:
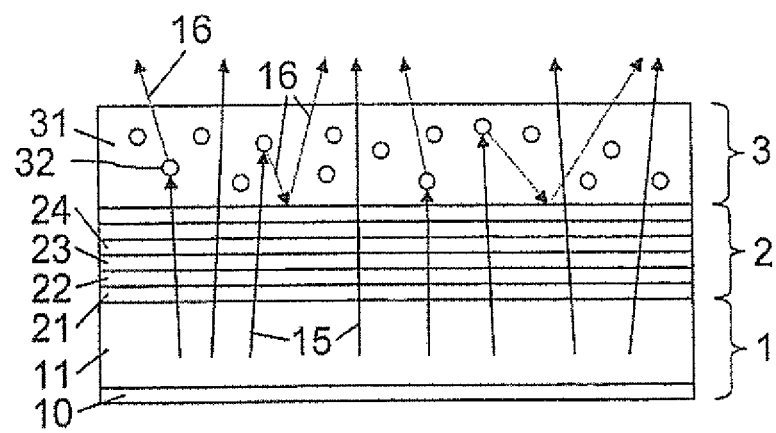
FIG. 1 shows a schematic illustration of an optoelectronic component in accordance with one exemplary embodiment during operation.

FIG. 1 shows an exemplary embodiment of an optoelectronic component. The optoelectronic component has an organic layer sequence 1 having an electrode 10 and an active region 11. In this case, as explained in the general part of the description, the organic layer sequence 1 can have functional layers or layer sequences and is embodied as an OLED, for example. In particular, the active region 11 of the organic layer sequence 1 is suitable for emitting electromagnetic radiation 15 having a first wavelength spectrum.

A dielectric layer sequence 2 and a wavelength conversion region 3 are arranged in the beam path of the electromagnetic radiation 15 having the first wavelength spectrum. The wavelength conversion region 3 comprises a wavelength conversion substance 32, which, as shown in the exemplary embodiment, is embedded into a matrix material 31, for example. The dielectric layer sequence 2 comprises, inter alia, layers 21, 22, 23, 24, wherein adjacent layers in each case are preferably formed from materials having different dielectric constants. Accordingly, the layers 21 to 24 can also have different refractive indexes.

In this case, the wavelength conversion substance 32 is suitable for converting at least partially a partial spectrum of the electromagnetic radiation 15 having the first wavelength spectrum into electromagnetic radiation 16 having a second wavelength spectrum. In this case, suitable materials for the wavelength conversion substance 32 can be, in particular, materials which have an absorption spectrum which contains at least one spectral component, in particular one wavelength range, which is also contained in the first wavelength spectrum. The absorbed electromagnetic radiation can then preferably be re-emitted with a different wavelength than the electromagnetic radiation 15 having the first wavelength spectrum.

As a result of the particular arrangement of the individual layers 21 to 24 in the dielectric layer sequence 2, the latter is opaque to an electromagnetic radiation having a third wavelength spectrum, which corresponds to at least one part of the second wavelength spectrum. In this exemplary embodiment, the electromagnetic radiation 15 having the first wavelength spectrum, which is preferably emitted substantially perpendicularly by the organic layer sequence, can pass through the dielectric layer sequence 2 in a largely unimpeded manner and substantially without any alteration of its spectral components. To put it another way, the dielectric layer sequence 2 is largely transparent to electromagnetic radiation 15 having the first wavelength spectrum. At specific angles of incidence, however, the dielectric layer sequence 2 can also be opaque to electromagnetic radiation 15 having the first wavelength spectrum.

The electromagnetic radiation 16 having the second wavelength spectrum, which is emitted isotropically from the wavelength conversion region 3, therefore emerges in part together with the electromagnetic radiation 15 having the first wavelength spectrum from the optoelectronic component. However, part of the radiation 16 is emitted in the direction of the dielectric layer sequence 2, but this part cannot penetrate through the dielectric layer sequence 2, but rather is reflected. Accordingly, a combination of electromagnetic radiation having the first wavelength spectrum and electromagnetic radiation 16 having the second wavelength spectrum is emitted during the operation of the optoelectronic component. An observer of the optoelectronic component can thus be given a color impression which results from a superimposition of the first and second wavelength spectra. By way of example, the first wavelength spectrum comprises a blue wavelength range and the second wavelength spectrum comprises a yellow wavelength range, such that a white color impression arises for an observer in this case.

Since, in the present exemplary embodiment, converted electromagnetic radiation 16 cannot be radiated back into the organic layer sequence 1, but rather is reflected at the dielectric layer sequence 2, a particular absorption of already converted radiation 16 in the organic layer sequence 1 can be avoided. The efficiency of the optoelectronic component is thereby increased.

As a result of the material constitution of the layers of the dielectric layer sequence 2, the latter is at least partially opaque to electromagnetic radiation having a third wavelength spectrum, which corresponds to at least one part of the second wavelength spectrum. Preferably, the dielectric layer sequence 2 is almost completely opaque to electromagnetic radiation having the second wavelength spectrum and the third wavelength spectrum, respectively. By way of example, for this purpose, adjacent layers, for example the layers 21, 22, have different refractive indexes. As a result of the jump in refractive index, electromagnetic radiation or light having a specific wavelength cannot penetrate through the layer sequence 2.

In one exemplary embodiment, the dielectric layer sequence 2 has a periodic succession of first layers 21, 23 and second layers 22, 24, wherein the first layers have a first refractive index and the second layers have a second refractive index, which is different from the first refractive index. In this case, the first and second layers can each have an identical layer thickness. As an alternative, the first layers 21, 23 and also the second layers 22, 24 can each have different refractive indexes, such that for example each of the layers of the dielectric layer sequence 2 has a different refractive index. In this case, however, higher and lower refractive indexes in the layers should alternate with one another. As an alternative or in addition, the layer thicknesses of the layers 21 to 24 can also vary as desired. Moreover, the number of layers in the dielectric layer sequence 2 is not restricted to the number of six layers shown here in this exemplary embodiment, but rather can also be higher or lower. By way of example, the dielectric layer sequence has a number of eight or more layers.

The dielectric layer sequence 2 can have a limiting wavelength, wherein the dielectric layer sequence 2 is substantially transmissive to electromagnetic radiation having a wavelength less than the limiting wavelength and is substantially opaque to electromagnetic radiation having a wavelength greater than the limiting wavelength. In this case, the limiting wavelength can depend for example on a respective layer thickness and/or respective refractive indexes of the layers of the dielectric layer sequence 2.

In this exemplary embodiment, the dielectric layer sequence 2 and the wavelength conversion region 3 are in indirect or direct contact with the organic layer sequence 1. To put it another way, the organic layer sequence 1, the dielectric layer sequence 2 and the wavelength conversion region 3 form a common interconnected structure. A wavelength conversion with an optoelectronic component in accordance with this exemplary embodiment can also be referred to as chip level conversion, CLC.

Figure 2:
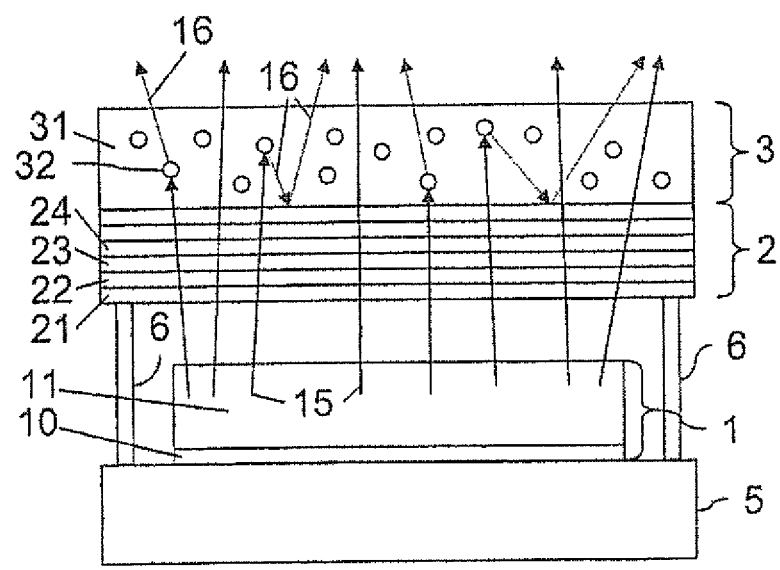
FIG. 2 shows a schematic illustration of an optoelectronic component in accordance with a further exemplary embodiment during operation.

In the exemplary embodiment in accordance with FIG. 2, an optoelectronic component is described whose basic functioning corresponds to that of the exemplary embodiment in accordance with FIG. 1. However, in this exemplary embodiment, the organic layer sequence 1 is arranged spatially separately from the dielectric layer sequence 2 and the wavelength conversion region 3. For this purpose, the organic layer sequence 1 is applied to a carrier substrate 5 and, for example, encapsulated thereon (not shown). Furthermore, holding elements 6 are provided, which constitute a mechanical mount for holding the dielectric layer sequence 2 and the wavelength conversion region 3 at a distance. The mount closes off a space in which the organic layer sequence 1 is arranged, for example, in an airtight or gastight manner. By way of example, the space thus formed between the dielectric layer sequence 2 and the organic layer sequence 1 is filled with a transparent gaseous substance, preferably a noble gas.

As described above for the exemplary embodiment in FIG. 1, electromagnetic radiation 15 having the first wavelength spectrum is emitted by the organic layer sequence 1, passes through the dielectric layer sequence 2 and is at least partially converted into electromagnetic radiation 16 having the second wavelength spectrum in the wavelength conversion region 3. Once again, already converted electromagnetic radiation 16 is prevented from being radiated back into the organic layer sequence 1 by the dielectric layer sequence 2.

Since the wavelength conversion region 3 is arranged at a distance from the radiation-emitting organic layer sequence 1 in this exemplary embodiment, this is also referred to as a "remote phosphor" arrangement.

Figure 3:
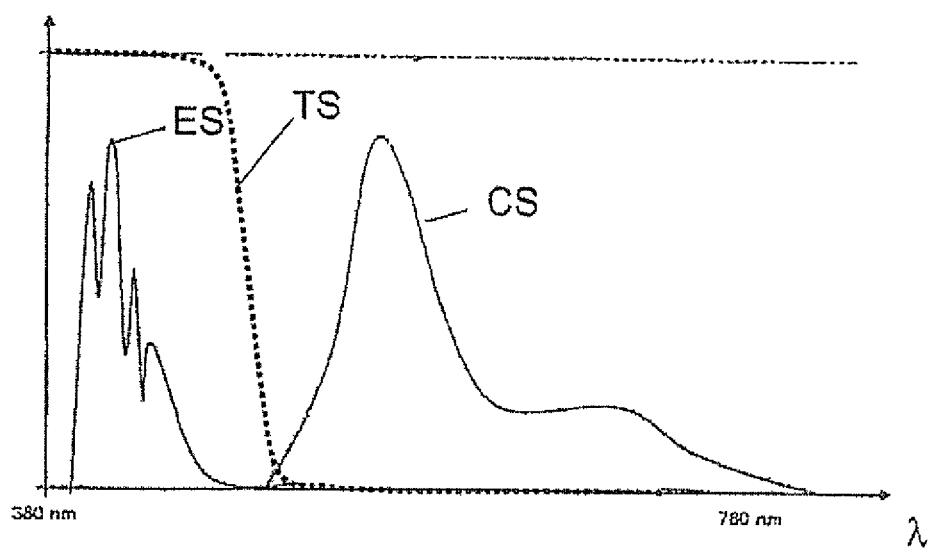
FIG. 3 shows an exemplary spectral diagram.

FIG. 3 shows an exemplary spectral diagram with different transmission characteristics and emission characteristics as a function of a wavelength λ. An emission characteristic or an emission spectrum ES represents, for example, a spectral profile of the electromagnetic radiation 15 emitted by the organic layer sequence 1. In this case, the emission spectrum ES comprises a blue wavelength range. A conversion spectrum CS represents the wavelength spectrum which is emitted by the wavelength conversion region 3 and on which the electromagnetic radiation 16 is based, by way of example. The conversion spectrum CS accordingly comprises a yellow wavelength range and a red-green wavelength range, respectively. The curve designated by TS indicates a transmission spectrum of the dielectric layer sequence 2. Accordingly, the dielectric layer sequence 2 is transmissive to blue light and thus to the electromagnetic radiation 15 emitted by the organic layer sequence 1, while it is opaque to electromagnetic radiation having a yellow wavelength range and a red and green wavelength range. Therefore, converted electromagnetic radiation 16 cannot pass trough the dielectric layer sequence 2.

A transmission characteristic TS and in particular a transparency of the dielectric layer sequence 2 can additionally also depend on an angle of incidence of the respective electromagnetic radiation. A limiting wavelength, starting from which a dielectric layer sequence in accordance with one of the exemplary embodiments described reflects, is dependent on an angle of incidence of the electromagnetic radiation or of the light. The limiting wavelength defined for an angle of incidence of zero degrees shifts to shorter wavelengths for larger angles. Such a dielectric filter layer thus permits an orientation of the emission characteristic of the optoelectronic component.

Perpendicularly emitted blue or blue-green light from the organic layer sequence can pass through the dielectric layer sequence in an unimpeded manner.

However, if blue or blue-green light is backscattered onto the organic layer sequence, this light can pass through the dielectric filter layer only in the case of incidence in the chosen angle range, however. Accordingly, blue or blue-green light which is backscattered at a larger angle in the direction of the organic layer sequence is reflected back into the wavelength conversion region 3 by the dielectric layer sequence 2. Consequently, absorption of backscattered blue or blue-green light is additionally reduced. The longer-wave converted light from the wavelength conversion region 3 cannot reach the organic layer sequence 1 at any angle of incidence, on account of the transmission characteristic of the dielectric layer sequence 2. Consequently, an angle-dependent transmission or reflection of at least parts of the electromagnetic radiation having the first wavelength spectrum further increases the efficiency of the optoelectronic component.

An optoelectronic component in accordance with one of the exemplary embodiments illustrated can be suitable for example as a component for a flashlight, for a mobile telephone application with a camera. Furthermore, such an optoelectronic component can also be suitable for illumination devices, for example for general lighting.

The invention is not restricted to the exemplary embodiments by the descriptions on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An optoelectronic component, comprising:
   an organic layer sequence, which emits an electromagnetic radiation having a first wavelength spectrum during operation;
   a wavelength conversion region in a beam path of the electromagnetic radiation emitted by the organic layer sequence, said wavelength conversion region being configured to convert at least partially electromagnetic radiation having the first wavelength spectrum into an electromagnetic radiation having a second wavelength spectrum; and a dielectric layer sequence, which is arranged in the beam path of the electromagnetic radiation emitted by the organic layer sequence between the organic layer sequence and the wavelength conversion region and which is at least partially opaque to an electromagnetic radiation having a third wavelength spectrum, which corresponds to at least one part of the second wavelength spectrum.

2. The optoelectronic component as claimed in claim 1, wherein the dielectric layer sequence is at least partially transparent to the electromagnetic radiation having the first wavelength spectrum.

3. The optoelectronic component as claimed in claim 2, wherein a transparency of the dielectric layer sequence to the electromagnetic radiation having the first wavelength spectrum is dependent on a respective angle of incidence.

4. The optoelectronic component as claimed in claim 1, wherein the first wavelength spectrum comprises a blue and/or a green wavelength range and the second wavelength spectrum comprises a yellow wavelength range.

5. The optoelectronic component as claimed in claim 1, wherein the dielectric layer sequence at least predominantly reflects the electromagnetic radiation having the third wavelength spectrum.

6. The optoelectronic component as claimed in claim 1, wherein the dielectric layer sequence has at least two layers having different dielectric constants.

7. The optoelectronic component as claimed in claim 6, wherein adjacent layers of the at least two layers of the dielectric layer sequence have different refractive indexes.

8. The optoelectronic component as claimed in claim 1, wherein the dielectric layer sequence has a periodic succession of first layers and second layers and the first layers have a first refractive index and the second layers have a second refractive index, which is different from the first refractive index.

9. The optoelectronic component as claimed in claim 1, wherein the dielectric layer sequence has a limiting wavelength, wherein the dielectric layer sequence is substantially transmissive to electromagnetic radiation having a wavelength less than the limiting wavelength and is substantially opaque to electromagnetic radiation having a wavelength greater than the limiting wavelength.

10. The optoelectronic component as claimed in claim 1, wherein the dielectric layer sequence is embodied as a thin-film stack.

11. The optoelectronic component as claimed in claim 1, wherein the dielectric layer sequence and the wavelength conversion region are in indirect or direct contact with the organic layer sequence.

12. The optoelectronic component as claimed in claim 11, wherein the dielectric layer sequence is in direct contact with the organic layer sequence and with the wavelength conversion region.

13. The optoelectronic component as claimed in claim 1, having an encapsulation, for the organic layer sequence, which is disposed upstream or disposed downstream of the wavelength conversion region in the beam path of the electromagnetic radiation emitted by the organic layer sequence.

14. The optoelectronic component as claimed in claim 13, wherein the encapsulation is embodied as a thin-film encapsulation.

15. The optoelectronic component as claimed in claim 13, wherein the encapsulation is formed by the dielectric layer sequence.

* * * * *